(12) United States Patent
Matsuoka

(10) Patent No.: US 11,462,555 B2
(45) Date of Patent: Oct. 4, 2022

(54) SEMICONDUCTOR STORAGE DEVICE AND MANUFACTURING METHOD THEREOF

(71) Applicant: KIOXIA CORPORATION, Tokyo (JP)

(72) Inventor: Shun Matsuoka, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 134 days.

(21) Appl. No.: 17/010,751

(22) Filed: Sep. 2, 2020

(65) Prior Publication Data

US 2021/0296355 A1 Sep. 23, 2021

(30) Foreign Application Priority Data

Mar. 17, 2020 (JP) .............................. JP2020-046846

(51) Int. Cl.

| H01L 27/11573 | (2017.01) |
|---|---|
| H01L 27/11582 | (2017.01) |
| H01L 27/1157 | (2017.01) |
| H01L 21/265 | (2006.01) |
| H01L 21/02 | (2006.01) |
| H01L 27/11575 | (2017.01) |

(52) U.S. Cl.
CPC .. *H01L 27/11573* (2013.01); *H01L 21/02532* (2013.01); *H01L 21/02598* (2013.01); *H01L 21/26513* (2013.01); *H01L 27/1157* (2013.01); *H01L 27/11575* (2013.01); *H01L 27/11582* (2013.01)

(58) Field of Classification Search
CPC ......... H01L 21/02532; H01L 21/02598; H01L 21/24; H01L 21/265; H01L 21/26513; H01L 21/2652; H01L 27/115; H01L 27/11563; H01L 27/11568; H01L 27/1157; H01L 27/11573; H01L 27/11575; H01L 27/11582; H01L 27/24; H01L 27/2454; C30B 23/02; C30B 25/02
See application file for complete search history.

(56) References Cited

U.S. PATENT DOCUMENTS

| 10,685,981 B2 | 6/2020 | Kanno et al. |
|---|---|---|
| 2019/0157294 A1 | 5/2019 | Kanamori et al. |
| 2019/0279878 A1 | 9/2019 | Furukawa |
| 2019/0287997 A1 | 9/2019 | Komiya et al. |
| 2019/0287998 A1 | 9/2019 | Harada et al. |
| 2019/0362970 A1 | 11/2019 | Wang et al. |
| 2020/0075623 A1 | 3/2020 | Ito et al. |

FOREIGN PATENT DOCUMENTS

| JP | 2019096729 A | 6/2019 |
|---|---|---|
| TW | 201939715 A | 10/2019 |
| TW | 202010055 A | 3/2020 |
| TW | 202011581 A | 3/2020 |

*Primary Examiner* — Cheung Lee

(74) *Attorney, Agent, or Firm* — Kim & Stewart LLP

(57) ABSTRACT

According to one embodiment, a semiconductor storage device includes a first structural body on a semiconductor material. The first structural body having a plurality of first conductive films and a plurality of first insulating films that are alternately stacked. A first columnar body penetrates the first structural body and includes a first epitaxial layer on an end adjacent to the semiconductor material. A second columnar body also penetrates the first structural body and includes a second epitaxial layer on an end adjacent to the semiconductor material. A portion of the second epitaxial layer is doped with boron.

20 Claims, 9 Drawing Sheets

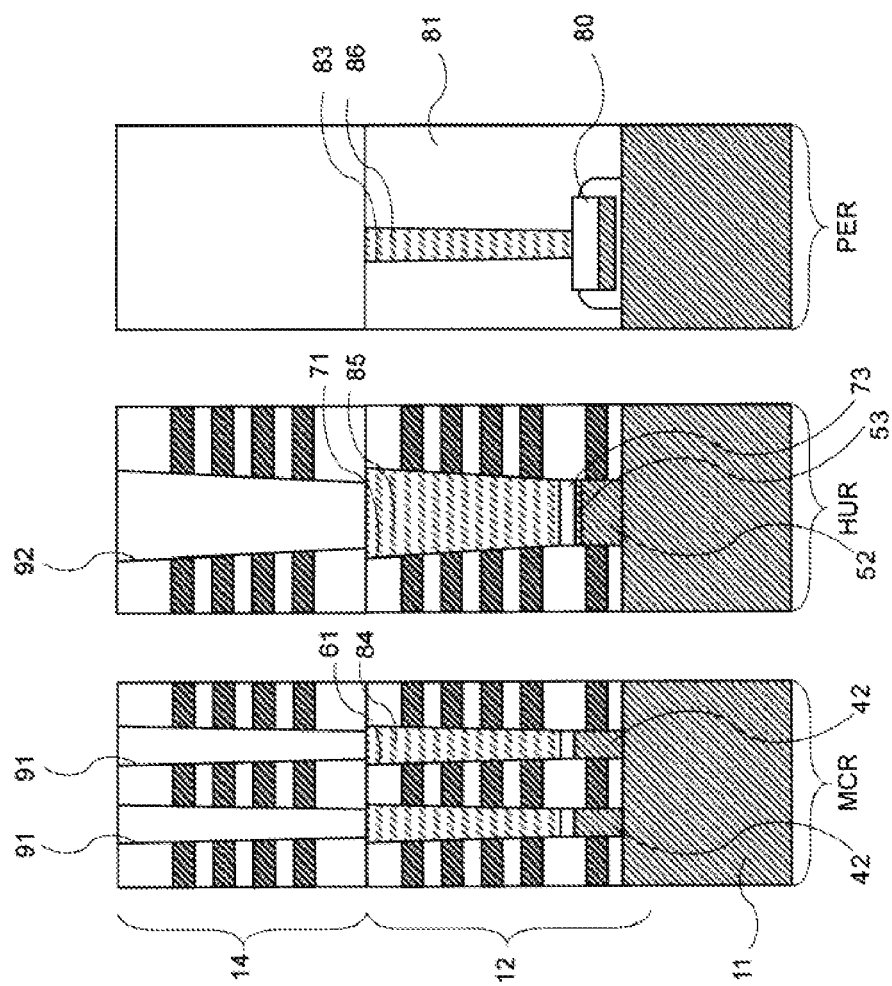

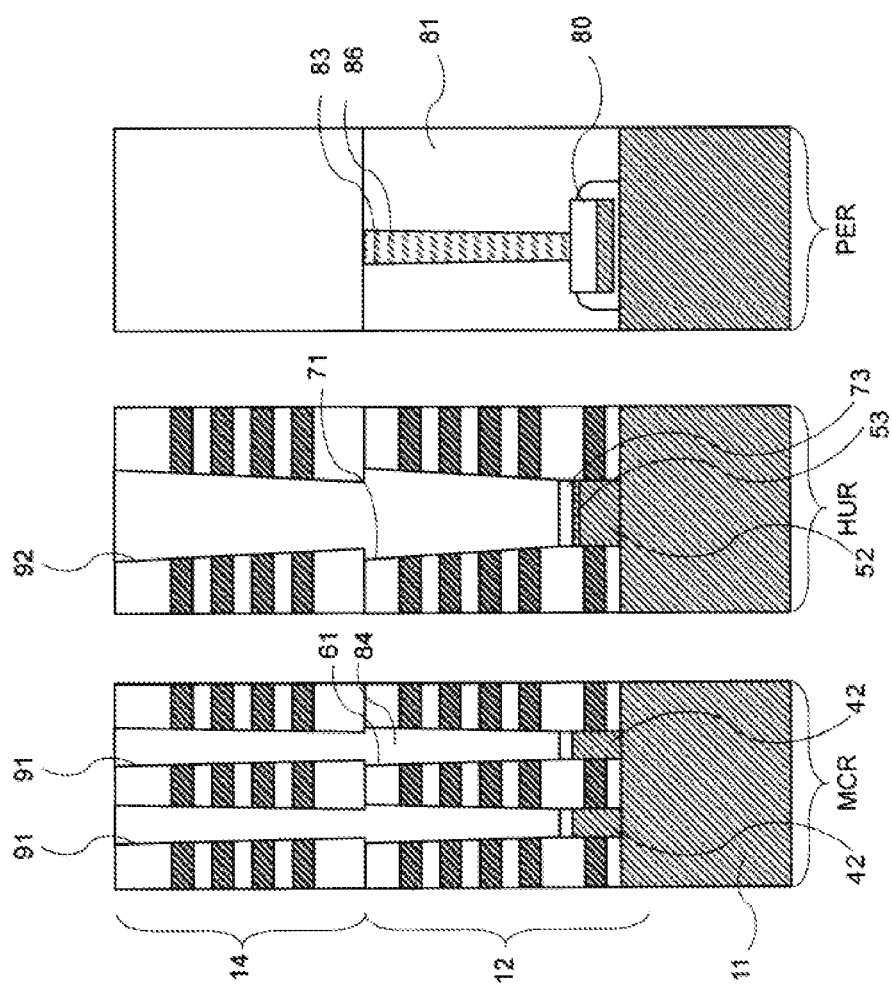

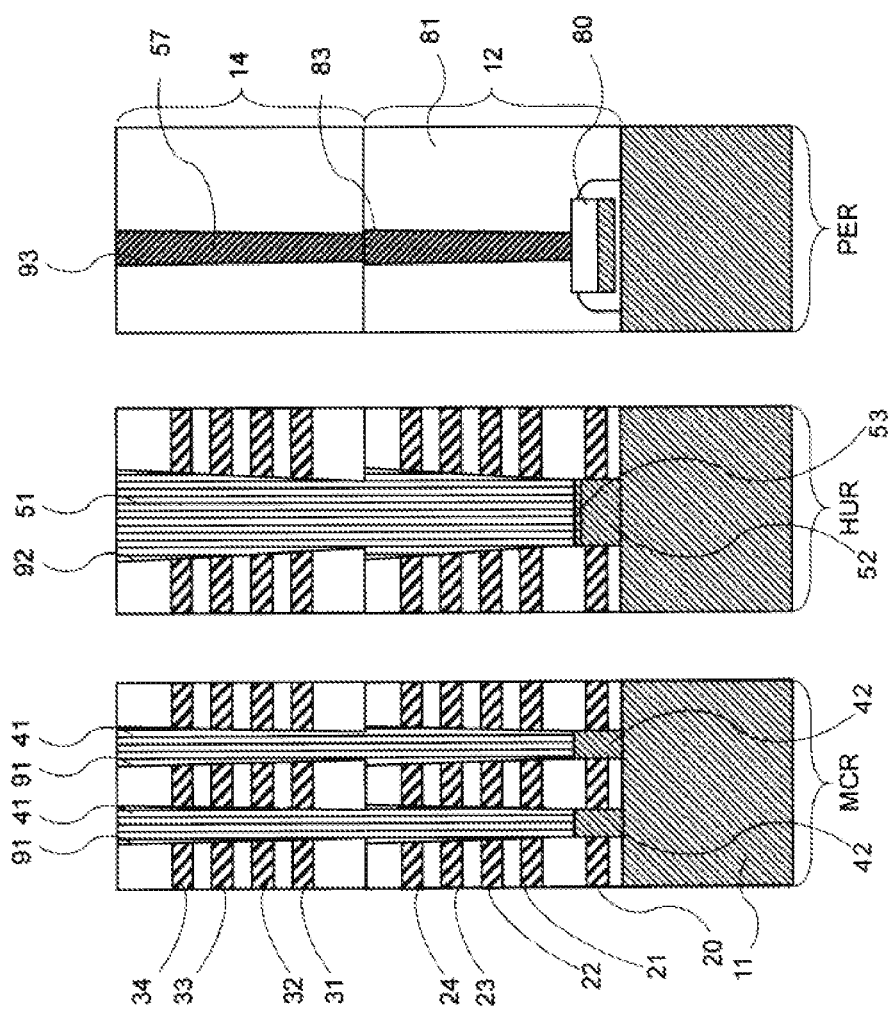

SEMICONDUCTOR STORAGE DEVICE AND MANUFACTURING METHOD THEREOF

CROSS-REFERENCE TO RELATED APPLICATION(S)

This application is based upon and claims the benefit of priority from Japanese Patent Application No. 2020-046846, filed Mar. 17, 2020, the entire contents of which are incorporated herein by reference.

FIELD

Embodiments described herein relate generally to a semiconductor storage device and a manufacturing method for a semiconductor storage device.

BACKGROUND

A NAND-type flash memory is known as one type of semiconductor storage device. In order to increase the capacity of NAND-type flash memory, a three-dimensional NAND-type flash memory in which a large number of memory cells are stacked is often used in practice. In such a stacked three-dimensional NAND-type flash memory, it is generally necessary to improve reliability and increase manufacturing yield.

BRIEF DESCRIPTION OF THE DRAWINGS

FIGS. 3-9 provide cross-sectional views illustrating aspects of a method of manufacturing a semiconductor storage device according to a first embodiment.

DETAILED DESCRIPTION

Figure 1:
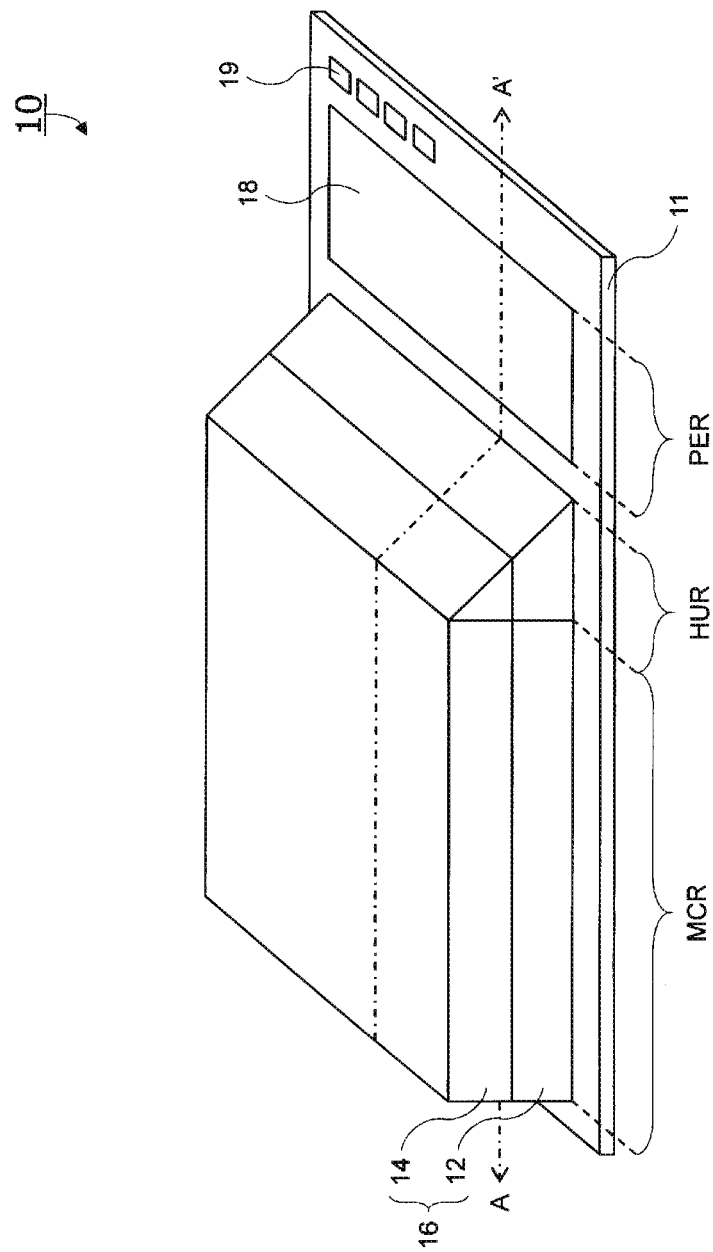
FIG. 1 is a perspective view of a semiconductor storage device according to a first embodiment.

Certain embodiments relate to increases in manufacturing yield and/or increases in reliability of a three-dimensional NAND-type flash memory.

In general, according to one embodiment, a semiconductor storage device includes semiconductor material with a first region and a second region. A first structural body comprising an alternating stack of first conductive films and first insulating films is in the first region and the second region. A first columnar body penetrates the first structural body in the first region and includes a first epitaxial layer on the semiconductor material end. A second columnar body penetrates the first structural body in the second region and includes a second epitaxial layer on the semiconductor material end. A second structural body comprising an alternating stack of second conductive films and second insulating films is on the first structural body in the first region and the second region. A third columnar body penetrates the second structural body in the first region and is in contact with the first columnar body. A fourth columnar body penetrates the second structural body in the second region and is in contact with the second columnar body. A portion of the second epitaxial growth layer is doped with boron.

Hereinafter, nonvolatile semiconductor storage devices according to example embodiments are described with reference to drawings. In the following description, those components having substantially the same functions and configurations are designated by the same reference numerals, and repeated descriptions are provided only when necessary. Each embodiment described below is provided for exemplifying a technical idea concept of the present disclosure, and these examples are non-limiting with regard to such aspects as particular materials, shapes, structures, arrangements, and the like of components being specified. Various modifications can be made to such aspects while still remaining within the scope of the present disclosure.

In order to make the description clearer, the width, thickness, shape, and the like of each part may be schematically illustrated as compared with such aspects in actual practice, and the depictions in the drawings are not intended to limit the present disclosure.

A plurality of films formed by the same process can have the same layer structure and comprise the same material. When portions of a film layer are divided, removed, or modified, each such portion may still be referred as being a part of the same film layer.

[Overall Configuration of Semiconductor Storage Device]

First, the overall configuration of the semiconductor storage device relating to the first embodiment is described with reference to FIG. 1. FIG. 1 is a perspective view illustrating an arrangement of a semiconductor storage device 10.

The semiconductor storage device 10 is a NAND-type flash memory device and includes memory cells that are three-dimensionally arranged (also referred to as stacked). For example, source-side select gate transistors, sixty-four (64) memory cell transistors, and drain-side select gate transistors are connected in series in a perpendicular direction in relation to the upper surface of a semiconductor substrate 11 to configure a memory string. Dummy cell transistors may be provided at one or both ends of many memory cell transistors connected in series or between different portions of series-connected memory cell transistors.

The semiconductor storage device 10 is formed on the semiconductor substrate 11. The semiconductor substrate 11 is partitioned into a memory cell region MCR and a lead-out region HUR. A memory cell array 16 including a plurality of memory cells three-dimensionally stacked is formed on the memory cell region MCR. The memory cell array 16 includes a lower layer structural body 12 and an upper layer structural body 14. The lower layer structural body 12 and the upper layer structural body 14 each include a plurality of conductive films and a plurality of insulating films alternately stacked. The plurality of conductive films become source-side select gate lines, word lines, and drain-side select gate lines connected to each transistor along the memory string. In FIG. 1, two different structural bodies (the lower layer structural body 12 and the upper layer structural body 14) are illustrated but in other examples three or more layers may be used. The lower layer structural body 12 and the upper layer structural body 14 extend to the lead-out region HUR. Bit lines are provided on the upper layer structural body 14.

A peripheral circuit region PER is also on the semiconductor substrate 11. A peripheral circuit 18 is formed on the peripheral circuit region PER. The peripheral circuit 18 includes, for example, many complementary metal-oxide-semiconductor (CMOS) transistors. The peripheral circuit 18 includes a column system circuit including a drive circuit that drives each word line connected to the memory cell, a decoder circuit that selects each word line, a sense amplifier that senses a bit line potential during reading, and a bit line potential control circuit that supplies voltage to a bit line during writing. In FIG. 1, the wiring of the peripheral circuit region PER is omitted. The semiconductor substrate 11 includes a row of pads 19 (a plurality of pads 19) that are used for exchanges of signals with an external device and/or receives power supply from outside of the chip.

[Configuration of the Memory Cell Region MCR and the Lead Region HUR]

Figure 2:
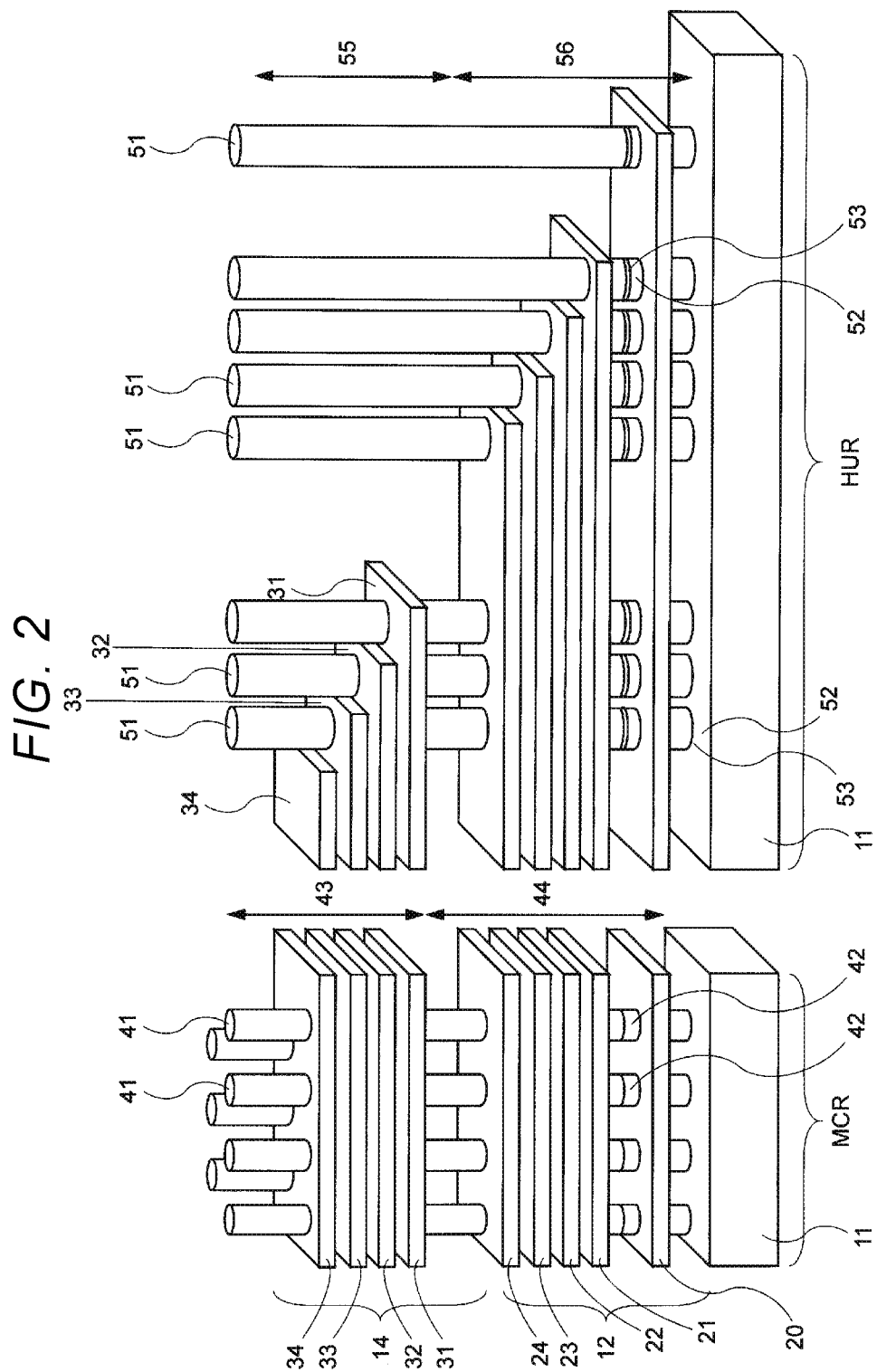
FIG. 2 is a perspective view illustrating a memory cell region and a lead-out region of a semiconductor storage device relating to a first embodiment.

FIG. 2 is a perspective view illustrating configurations of the memory cell region MCR and the lead-out region HUR of the semiconductor storage device relating to the embodiment. In order to prevent the drawing from being overly complicated, only the conductive members are directly illustrated, and the insulating members between conductive layers is omitted. Insulating members and/or material should be understood to be present between the conductive layers in this example in FIG. 2. That is, though not depicted with hatching or the like, in FIG. 2, insulating material such as $SiO_2$ is present in the gaps between conductive layers and/or semiconductive components.

In the memory cell region MCR, the lower layer structural body 12 and the upper layer structural body 14 are each formed on the semiconductor substrate 11 using single-crystal silicon. The lower layer structural body 12 includes an insulating film, a conductive film 20, an insulating film, a conductive film 21, an insulating film, a conductive film 22, an insulating film, a conductive film 23, an insulating film, a conductive film 24, and the like, which extend in parallel in relation to the upper surface of the semiconductor substrate 11. In the lower layer structural body 12, these different insulating films and conductive films are alternately stacked on each other. In the drawings, only five layers of conductive films (20 to 24) are specifically illustrated, but more conductive layers such as, for example, thirty-three conductive layers or sixty-five conductive layers can be stacked in other examples. These conductive films correspond to the source-side select gate lines and the word lines connected to corresponding selection transistors or memory cell transistors.

The upper layer structural body 14 also includes an insulating film, a conductive film 31, insulating film, a conductive film 32, an insulating film, a conductive film 33, an insulating film, a conductive film 34, and the like, which extend in parallel in relation to the upper surface of the semiconductor substrate 11. Also, in the upper layer structural body 14, these insulating films and conductive films are alternately stacked on each other. In the drawings, only four layers of conductive films (31 to 34) are illustrated, but more conductive layers, such as thirty-three conductive layers or sixty-five layers can be stacked in other examples. These conductive films correspond to word lines or drain-side select gate lines connected to selection transistors or memory cell transistors. A thick insulating layer is provided between the lower layer structural body 12 and the upper layer structural body 14.

Memory pillars 41 penetrating the lower layer structural body 12 and the upper layer structural body 14 are formed. Each memory pillar 41 includes a lower layer memory pillar portion 44 (also referred to as a first columnar body portion) that penetrates the lower layer structural body 12 and an upper layer memory pillar portion 43 (also referred to as a third columnar body portion) that penetrates the upper layer structural body 14. The lower layer memory pillar portion 44 includes epitaxial growth layers 42 near the semiconductor substrate 11. The epitaxial growth layers 42 is formed by epitaxially growing single-crystal silicon on the semiconductor substrate 11, which can itself comprise single-crystal silicon. The upper layer memory pillar portion 43 is connected to the lower layer memory pillar portion 44.

The memory pillar 41 can be considered to have a tubular shape, and a silicon dioxide film, a silicon nitride film, a silicon dioxide film, an amorphous or polycrystalline silicon film, and a silicon dioxide film are stacked from the outer peripheral side of the memory pillar 41 toward the center of the memory pillar 41. Portions of the memory pillars adjacent to and respectively surrounded by the conductive films 20, 21, 22, 23, 24, 31, 32, 33, and 34 (that is, the conductive films corresponding to select gate lines or word lines) function as portions of nonvolatile memory cells that trap carriers in the silicon nitride films.

The reason why the memory pillar 41 includes the lower layer memory pillar portion 44 that penetrates the lower layer structural body 12 and the upper layer memory pillar portion 43 that penetrates the upper layer structural body 14 is because otherwise during manufacturing steps, the aspect ratio of openings that would have to be formed in an etching step would be to be too large if the memory holes were formed extending through both in the lower layer structural body 12 and the upper layer structural body 14 in a single etching process step. When the aspect ratio of a feature being formed by etching becomes too large, the etching process becomes difficult to accomplish. Thus, in this instance, the lower layer structural body 12 is first formed, a lower layer memory hole 61 (having a relatively small aspect ratio) that corresponds to the lower layer memory pillar portion 44 is opened. The lower layer memory hole 61 is subsequently filled with a sacrificial film (that is a film that can be later removed and replaced by another film or films). The upper layer structural body 14 is then formed. An upper layer memory hole 91 (having a relatively small aspect ratio) that corresponds to the upper layer memory pillar portion 43 is opened. At this time, the sacrificial film can be removed from the lower layer memory hole 61. Thereafter, the upper layer memory pillar portion 43 and the lower layer memory pillar portion 44 are simultaneously formed inside a memory hole having a large aspect ratio (that is, the lower layer memory hole 61 and the upper layer memory hole 91 connected to each other).

The lower layer structural body 12 and the upper layer structural body 14 are formed on the semiconductor substrate 11 of single-crystal silicon in the lead-out region HUR. The lower layer structural body 12 in this region also includes an insulating film, the conductive film 20, an insulating film, the conductive film 21, an insulating film, the conductive film 22, an insulating film, the conductive film 23, an insulating film, the conductive film 24, and the like which extend in parallel in relation to the upper surface of the semiconductor substrate 11. In the lower layer structural body 12, these insulating films and conductive films are alternately stacked on each other. In the drawings, only five layers of conductive films (20 to 24) are illustrated, but just like in the memory cell region MCR, more layers, such as thirty-three layers or sixty-five layers, can be stacked. The depicted conductive films corresponding to the word lines and the source-side select gate lines in the memory cell region MCR extend to the lead-out region HUR. The portion of these conductive films in the lead-out region HUR are used for making connections to the word lines and the source-side select gate lines.

The upper layer structural body 14 in the lead-out region HUR also includes the same components as the upper layer structural body 14 in the memory cell region MCR. These conductive films in the lead-out region HUR correspond to the word lines and the drain-side select gate lines in the memory cell region MCR, and the portion of these conductive films in the lead-out region HUR are used for making connections to the word lines and the source-drain select gate lines.

In the lead-out region HUR, the conductive films 20, 21, 22, 23, 24, 31, 32, 33, and 34 are electrically connected to other components by via connections or the like. These via connections are not separately depicted in FIG. 2, but respectively extend from regions of each conductive film 20, 21, 22, 23, 24, 31, 32, 33, and 34 to an upper layer wiring or the like. To make lead-out possible, the ends of the conductive films 20, 21, 22, 23, 24, 31, 32, 33, and 34 in the lead-out region HUR are shifted with respect to one another. That is, as depicted in FIG. 2, the ends of the conductive layers are in a stair-stepped or terraced arrangement.

In the lead-out region HUR, support pillars 51 penetrating the lower layer structural body 12 and the upper layer structural body 14 are formed. The support pillar 51 includes a lower layer support pillar portion 56 (also referred to as a second columnar body portion) that penetrates the lower layer structural body 12. The support pillar 51 includes an upper layer support pillar portion 55 (also referred to as a fourth columnar body portion) that penetrate the upper layer structural body 14. The lower layer support pillar portion 56 includes an epitaxial growth layer 52 near the semiconductor substrate 11. The epitaxial growth layer 52 is formed by epitaxially growing single-crystal silicon on the semiconductor substrate 11, which also includes single-crystal silicon. The upper layer support pillar portion 55 is connected to the lower layer support pillar portion 56.

When the conductive films 20, 21, 22, 23, 24, 31, 32, 33, and 34, and the like are formed, the support pillars 51 are provided to support the insulating films therebetween so that these insulating films are not bent during fabrication steps or the like. That is, the support pillar 51 is not intended to function as a nonvolatile memory cell structure, but rather is present for structural support purposes.

The support pillars 51 have tubular shapes, and a silicon dioxide film, a silicon nitride film, a silicon dioxide film, an amorphous or polycrystalline silicon film, and a silicon dioxide film are stacked from the outer peripheral side toward the center. Such a structure is generally to permit the support pillars 51 together with the memory pillars 41 in the same processing step(s). However, as noted, a support pillar 51 does not have a role as a nonvolatile memory cell and just functions as a physical support structure.

The support pillar 51 has a larger diameter than that of the memory pillar 41 and thus has a larger cross-sectional area. The support pillars 51 are less densely packed as compared to spacing distance between the memory pillars 41. In other words, the support pillars 51 do not have to be as densely arranged as the memory pillars 41.

The lower layer support pillar portion 56 includes the epitaxial growth layer 52 near the semiconductor substrate 11. Also, a portion of the epitaxial growth layer 52 (more particularly, a portion near the upper surface of the epitaxial growth layer 52) comprises a boron-doped region 53. The boron-doped region 53 is doped with boron at a dopant concentration of, for example, $1\times10^{18}$ cm$^{-3}$ or more. The doping with boron can be performed by vapor phase diffusion but is preferably performed by an ion implantation method. The boron concentration in the epitaxial growth layer 52 is less than the boron concentration of the boron-doped region 53.

[Fabrication of Memory Pillar, Support Pillar, and Transistor Contact]

FIGS. 3 to 9 are cross-sectional views illustrating aspects of a method of manufacturing a semiconductor storage device according to a first embodiment.

Figure 3:
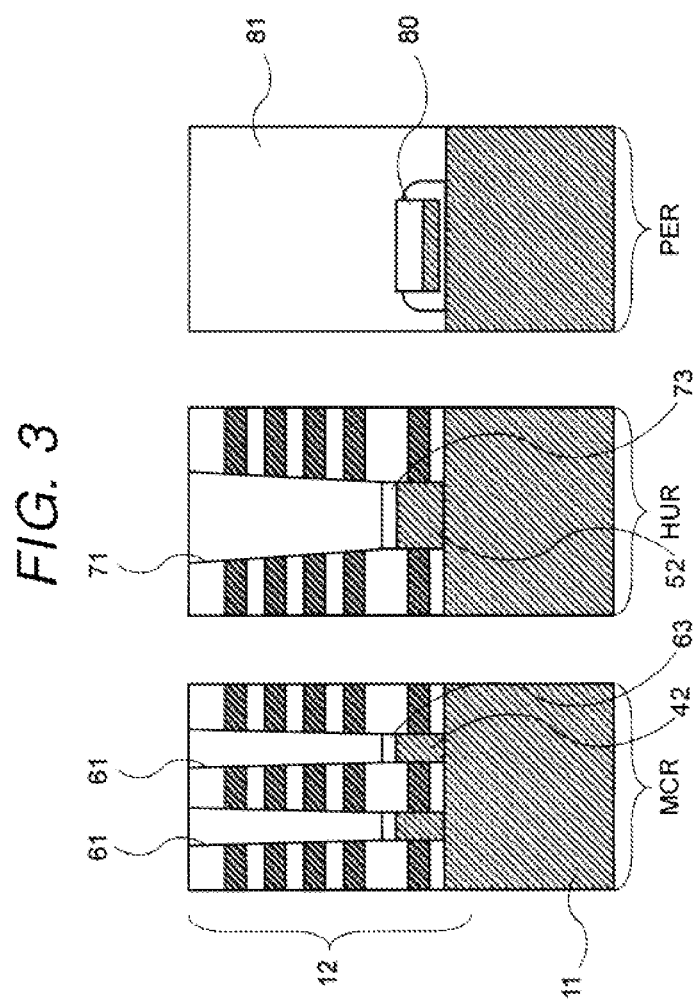

As illustrated in FIG. 3, a transistor 80 is formed on the semiconductor substrate 11. The transistor 80 is a portion of the peripheral circuit 18.

Next, an alternating stack of silicon oxide (SiO$_2$) films (insulating films) and silicon nitride (Si$_3$N$_4$) film (dummy or sacrificial films) is formed on the semiconductor substrate 11 covering the memory cell region MCR and the lead-out region HUR. This stack is used for forming the lower layer structural body 12. These SiO$_2$ films and Si$_3$N$_4$ films are deposited by using a chemical vapor deposition (CVD) method or the like. A thick SiO$_2$ film 81 is formed on the transistor 80.

Subsequently, memory holes 61 and a support hole 71 are formed by selectively dry etching the lower layer structural body 12 by using a mask formed by photolithography or the like. Removing materials for the memory holes 61 and the support hole 71 exposes the semiconductor substrate 11 at the bottom of these holes.

Next, single-crystal silicon is epitaxially grown by using the semiconductor substrate 11 (exposed at the bottom of the memory holes 61 and the support hole 71) as seed crystal. The single-crystal silicon is epitaxially grown by using a CVD method and forms epitaxial growth layers 42 and 52. Then, the upper surfaces of the epitaxial growth layer 42 and 52 are later oxidized (e.g., thermal oxidation). Thus, SiO$_2$ films 63 (also referred to as first stopper insulating films) are formed on the upper surface of the epitaxial growth layer 42, and a SiO$_2$ film 73 (also referred to as a second stopper insulating film) is formed on the upper surface of an epitaxial growth layer 52.

Figure 4:
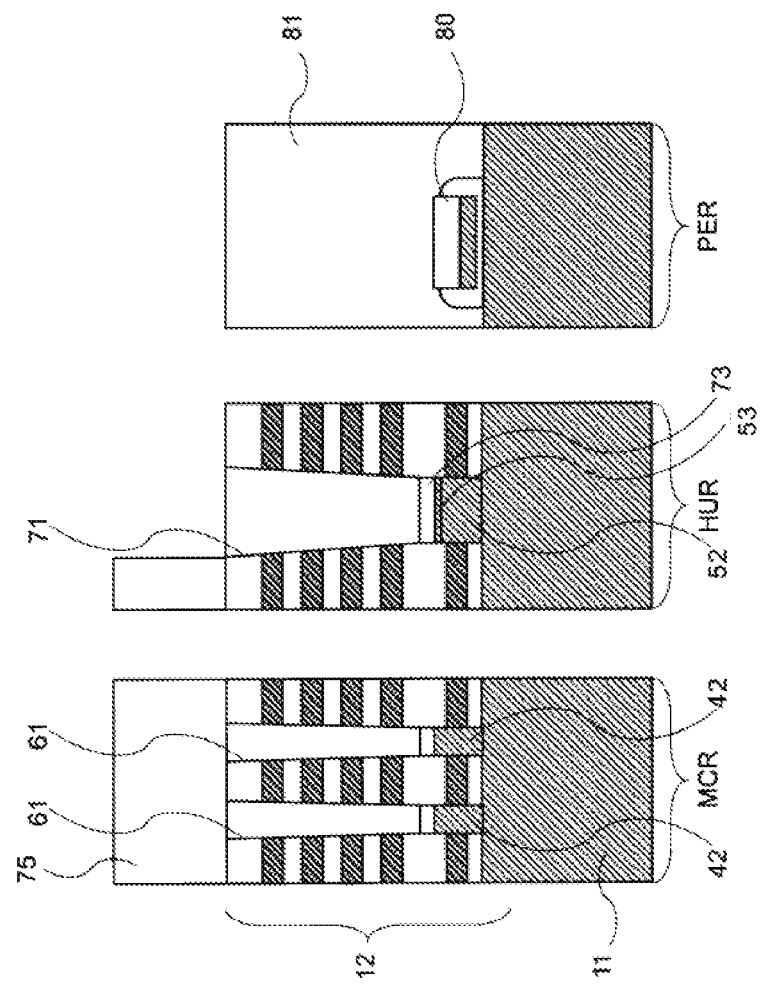

As illustrated in FIG. 4, a mask is formed by using a photoresist 75 to cover the memory holes 61 of the memory cell region MCR. At this point, the support hole 71 of the lead-out region HUR is left exposed by the photoresist 75. In this state, boron is ion-implanted. The implant dose amount is $1\times10^{15}$/cm$^2$ or more. As a result, a boron-containing region 53 having boron concentration of $1\times10^{18}$/cm$^3$ or more is formed on the upper surface of the epitaxial growth layer 52.

Figure 5:
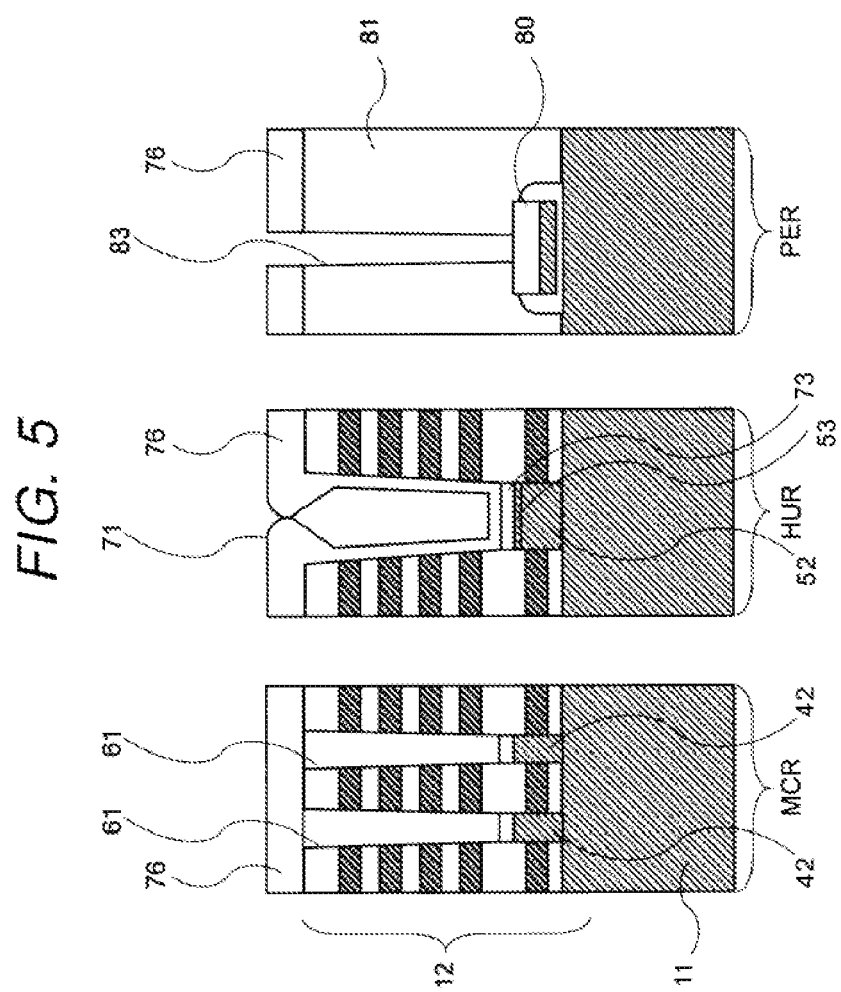

As illustrated in FIG. 5, the SiO$_2$ film 81 on the transistor 80 in the peripheral circuit region PER is selectively opened by using a hard mask 76 to form a transistor contact hole 83 in an etch process. Here, since the transistor contact hole 83 has a very high aspect ratio, it takes a long etching time to form the transistor contact hole 83, and, as a result, ions, such as chlorine ions, derived from silane, which is used as an etching gas, may be charged up near the bottom portion in the support hole 71. The film thickness of the hard mask 76 tends to be thin near the bottom portion of the support hole 71. This is because the diameter of the support hole is large and the arrangement density of the support holes is less than the arrangement density of the memory holes. As a result, chlorine ions charged up near the bottom portion of the support hole 71 more easily remain. After the transistor contact hole 83 is formed, the semiconductor substrate 11 is cleaned for the purpose of removing etching residues and the like. Dilute hydrofluoric acid (DHF) is used for cleaning the semiconductor substrate 11 in this process. When the semiconductor substrate 11 is cleaned by using DHF while chlorine ions still remain near the bottom portion of the support hole 71, the SiO$_2$ film 73 formed near the bottom portion of the support hole 71 may be destroyed. However, according to the present embodiment, it is possible to prevent destruction of the $SiO_2$ film 73 by forming the boron-containing region 53 directly under the $SiO_2$ film 73.

Figure 6:
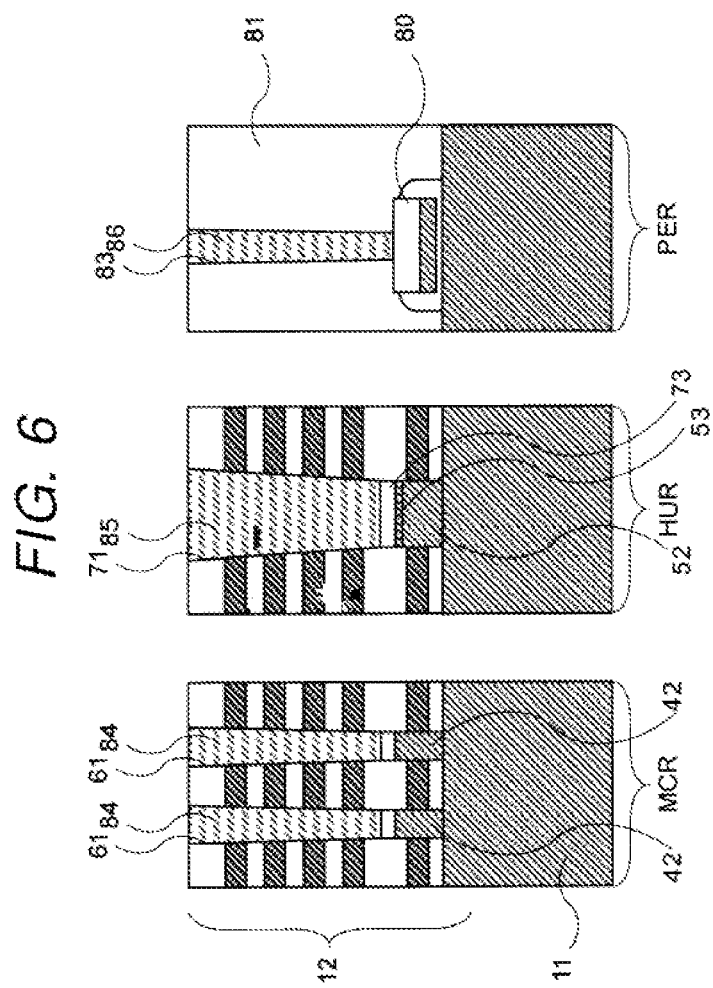

As illustrated in FIG. 6, the amorphous silicon films 84, 85, and 86 (sacrificial films) are embedded in the memory holes 61, the support hole 71, and the transistor contact hole 83, respectively. These amorphous silicon films 84, 85, and 86 are used for protecting side walls of the memory holes 61, the support hole 71, and the transistor contact hole 83 while forming the upper layer structural body 14. These amorphous silicon films 84, 85, 86 are removed later in the fabrication process.

As illustrated in FIG. 7, a stack of $SiO_2$ films (insulating films) and $Si_3N_4$ films (dummy films)) are formed on the lower layer structural body 12 after the various holes therein have been filled with the amorphous silicon films 84, 85, and 86. This stack of films is formed in the memory cell region MCR and the lead-out region HUR and is used to form the upper layer structural body 14. These $SiO_2$ films and $Si_3N_4$ films are deposited by using a CVD method.

Next, (upper layer) memory holes 91 and an (upper layer) support hole 92 are formed by selectively dry etching the upper layer structural body 14 by using a mask formed by photolithography or the like. The (upper layer) memory holes 91 open on the amorphous silicon film 84 in the (lower layer) memory holes 61, and the (upper layer) support hole 92 open on the amorphous silicon film 85 in the (lower layer) support hole 71.

In FIG. 8, the amorphous silicon films 84 and 85 are removed by etching via the (upper layer) memory holes 91 and the (upper layer) support hole 92. As a result, the memory holes and the support holes that extending through the lower layer structural body 12 and the upper layer structural body 14 are formed. Here, removal of the amorphous silicon films 84 and 85 by etching is preferably performed by using a wet etching process with trimethyl-2 hydroxyethyl ammonium hydroxide (TMY). Typically, TMY should be able to obtain sufficient selectivity using an $SiO_2$ film as a stopper film, but as described above, the $SiO_2$ film 73 formed near the bottom portion of the support hole 71 may be destroyed in some instances not corresponding to the present embodiment. If the $SiO_2$ film 73 is destroyed, and wet etching is performed by using TMY, the epitaxial growth layer 52 or the semiconductor substrate 11 can be damaged. Such damage would cause decreases in reliability and decreases in manufacturing yield. However, as described above, according to the present embodiment, the boron-containing region 53 doped with boron is formed directly under the $SiO_2$ film 73 before etching. The boron-containing region 53 helps by resisting etching by TMY even if there is a defect (e.g., a pin hole) in the $SiO_2$ film 73 or the like. As a result, destruction of the $SiO_2$ film 73 can be prevented by the boron-containing region 53 directly under the $SiO_2$ film 73.

As illustrated in FIG. 9, the $SiO_2$ films 63 and the $SiO_2$ film 73 have been removed by etching, but the epitaxial growth layers 42 and 52 remain inside the memory holes and the support holes and connected to the memory pillars 41 and the support pillars 51, respectively. As described above, in the memory pillars 41 and the support pillars 51, the silicon dioxide films, the silicon nitride films, the silicon dioxide films, the amorphous or polycrystalline silicon films, and the silicon dioxide films are stacked from the outer peripheral side toward the center. In a case of forming these memory pillars 41 and support pillars 51, thin films are deposited in the order of a silicon nitride film, a silicon dioxide film, an amorphous or polycrystalline silicon film, and then another silicon dioxide films.

Then, slits are etched into predetermined regions of the lower layer structural body and the upper layer structural body, and $Si_3N_4$ films (referred to as dummy films or sacrificial films) in the lower layer structural body and the upper layer structural body are removed via these slits in an etch processing. As a result, cavities are left in regions where the $Si_3N_4$ films were previously present. Once the $Si_3N_4$ films are removed, the support pillars are necessary so that bending of the remaining $SiO_2$ films of the lead-out region HUR can be prevented, and the structures can be maintained. The conductive films 20 to 24 and 31 to 34, described with reference to FIG. 2, are formed by embedding a metal, such as tungsten, into the cavities left by removal of the sacrificial silicon nitride films.

The upper layer structural body 14 in the peripheral circuit region PER is selectively opened to form an (upper layer) transistor contact hole 93. The (upper layer) transistor contact hole 93 exposes the amorphous silicon film 86 in the (lower layer) transistor contact hole 83, the amorphous silicon film 86 can be removed by an etching process via the (upper layer) transistor contact hole 93. As a result, a transistor contact hole extending through the lower layer structural body 12 and the upper layer structural body 14 is formed. A wiring pillar 57 (also referred to as a fifth columnar body), formed inside the transistor contact hole, electrically connects to the transistor 80. The wiring pillar 57 is formed by embedding metal such as tungsten into the transistor contact hole.

In a series of the above steps, the semiconductor storage device configured as illustrated in FIGS. 2 and 9 can be manufactured.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
   a semiconductor material with a first region and a second region;
   a first structural body on the semiconductor material in the first and second region, the first structural body comprising a stack of first conductive films and first insulating films alternating with each other;
   a first columnar body portion that penetrates the first structural body to the semiconductor material in the first region and includes a first epitaxial layer on a first end adjacent to the semiconductor material;
   a second columnar body portion that penetrates the first structural body to the semiconductor material in the second region and includes a second epitaxial layer on a first end adjacent to the semiconductor material;
   a second structural body on the first structural body in the first region and the second region, the second structural body comprising second conductive films and second insulating films alternating with each other;
   a third columnar body portion that penetrates the second structural body in the first region and contacts a second end of the first columnar body portion;

a fourth columnar body portion that penetrates the second structural body in the second region and contacts a second end of the second columnar body portion; and a boron-doped region in the second epitaxial layer.

2. The semiconductor storage device according to claim 1, wherein the first region is a memory cell region.

3. The semiconductor storage device according to claim 1, wherein the second region is a lead-out region.

4. The semiconductor storage device according to claim 1, further comprising:
   a transistor on the semiconductor material in a third region of the semiconductor material; and
   a fifth columnar body portion in the third region and electrically connected to a source, a drain, or a gate of the transistor.

5. The semiconductor storage device according to claim 1, wherein a cross-sectional area of the second columnar body portion is greater than a cross-sectional area of the first columnar body portion.

6. The semiconductor storage device according to claim 1, further comprising:
   a plurality of first columnar body portions in the first region; and
   a plurality of second columnar body portions in the second region, wherein
   a distance between adjacent first columnar body portions is less than a distance between adjacent second columnar body portions.

7. The semiconductor storage device according to claim 1, wherein a boron concentration of the boron-doped region is at least $1 \times 10^{18}$ cm$^{-3}$.

8. The semiconductor storage device according to claim 1, wherein the first epitaxial layer has a boron concentration that is less than a boron concentration of the boron-doped region.

9. The semiconductor storage device according to claim 1, wherein the first epitaxial layer is single-crystal silicon.

10. The semiconductor storage device according to claim 1, wherein the second epitaxial layer is single-crystal silicon.

11. The semiconductor storage device according to claim 1, wherein a portion of the semiconductor material adjacent to the first epitaxial layer is single-crystal silicon.

12. A method of manufacturing a semiconductor storage device, the method comprising:
   forming a first structural body on a semiconductor material in a first region and a second region of the semiconductor material, the first structural body comprising a plurality of first dummy films and a plurality of first insulating films that are alternately stacked;
   forming a first hole in the first structural body in the first region to reach the semiconductor material and a second hole in the first structural body in the second region to reach the semiconductor material;
   growing a first epitaxial layer on the semiconductor material exposed at the bottom of the first hole and a second epitaxial layer on the semiconductor material exposed at the bottom of the second hole by epitaxy;
   forming a first stopper insulating film and a second stopper insulating film on upper surfaces of the first epitaxial layer and the second epitaxial layer, respectively;
   doping the second epitaxial layer with boron;
   filling the first and second holes with a sacrificial material;
   forming a second structural body on the first structural body in the first and second regions after the first and second holes have been filled with the sacrificial material, the second structural body comprising a plurality of second dummy films and a plurality of second insulating films that are alternately stacked;
   forming a third hole in the second structural body that reaches the sacrificial material in the first hole and a fourth hole in the second structural body that reaches the sacrificial material in the second hole;
   removing the sacrificial material from the first hole through the third hole and from the second hole through the fourth hole;
   forming a first columnar body portion in the first hole and a third columnar body portion in contact with the first columnar body portion in the third hole;
   forming a second columnar body portion in the second hole and a fourth columnar body portion in contact with the second columnar body portion in the fourth hole;
   removing the first dummy films and the second dummy films; and
   forming conductive films in cavities left by the removing of the first dummy films and the second dummy films.

13. The method according to claim 12, wherein the second columnar body portion and the fourth columnar body portion form a support column used to support the second insulating films in the second region after the removing of the first dummy films and the second dummy films and before the forming of conductive films in the cavities.

14. The method according to claim 12, further comprising:
   forming a contact hole through an insulating material in a third region of the semiconductor material to reach one of a source, a drain, or a gate of a transistor formed on the semiconductor material in the third region, the contact hole being formed by etching the insulating material through a photoresist mask covering the first hole and the second hole in the first structural body and also a portion of the insulating material in the third region outside a position of the contact hole, and
   filling the contact hole with sacrificial material at the same time the first hole and the second hole are filled with sacrificial material.

15. The method according to claim 12, wherein a cross-sectional area of the second columnar body portion taken in a plane parallel to the semiconductor material is greater than a cross-sectional area of the first columnar body portion taken in a plane parallel to the semiconductor material.

16. The method according to claim 12, wherein the second epitaxial layer is doped with boron by ion implantation.

17. The method according to claim 16, wherein a dose of ions supplied to the second epitaxial layer is $1 \times 10^{15}$ cm$^{-2}$ or more.

18. The method according to claim 16, wherein a boron concentration in the second epitaxial layer is greater than a boron concentration of the first epitaxial layer.

19. The method according to claim 12, further comprising:
   forming a plurality of first holes in the first structural body in the first region and a plurality of second holes in the first structural body in the second region, wherein
   a distance between adjacent first holes is less than a distance between adjacent second holes.

20. A memory device, comprising:
   a plurality of memory pillars in a first region of a semiconductor material;
   a plurality of support pillars in a second region of the semiconductor material adjacent to the first region, wherein each support pillar includes a boron-doped region in a single-crystal silicon portion adjacent to the semiconductor material, and a boron concentration in each boron-doped region is at least $1\times10^{18}$ cm$^{-3}$.

* * * * *